United States Patent [19]
Park et al.

[11] Patent Number: 5,886,566
[45] Date of Patent: Mar. 23, 1999

[54] HIGH VOLTAGE CHARGE TRANSFER STAGE

[75] Inventors: Eungjoon Park; Hsi-Hsien Hung, both of Fremont, Calif.

[73] Assignee: Integrated Silicon Solution, Inc., Santa Clara, Calif.

[21] Appl. No.: 917,008

[22] Filed: Aug. 21, 1997

[51] Int. Cl.$^6$ .................................................... G05F 3/02
[52] U.S. Cl. ......................... 327/536; 327/390; 327/537
[58] Field of Search .................................... 327/536, 537, 327/390, 589; 307/110

[56] References Cited

U.S. PATENT DOCUMENTS

| | | | |
|---|---|---|---|
| 5,029,063 | 7/1991 | Lingstaedt et al. | 327/534 |
| 5,422,590 | 6/1995 | Coffman et al. | 327/537 |
| 5,489,870 | 2/1996 | Arakawa | 327/536 |
| 5,589,793 | 12/1996 | Kassapian | 327/536 |
| 5,701,096 | 12/1997 | Higashiho | 327/536 |

*Primary Examiner*—Terry D. Cunningham
*Attorney, Agent, or Firm*—Flehr Hohbach Test Albritton & Herbert LLP

[57] ABSTRACT

An improved charge transfer stage with an expanded output voltage range and high charge transfer efficiency is described. The charge transfer stage can be implemented as an output stage in a four phase clock negative charge pump system. The charge transfer stage comprises a PMOS pass transistor coupling the transfer stage input and output, a resistor between the transfer stage input and the pass transistor gate, a clock terminal, a capacitor configured PMOS transistor coupling the clock terminal to the gate of the pass transistor, and a diode from the transfer stage output to ground. When the transfer stage input goes low, charge is coupled through the resistor to pre-charge the gate of the pass transistor. The resistor has a higher junction breakdown voltage than a transistor which allows the gate of the pass transistor to be driven to a larger voltage. To provide sufficient charge to turn on the pass transistor, a logic high level greater than the power supply, such as 2 VCC, can be used for the clock signal coupled through the capacitor configured transistor to the gate of the pass transistor. To prevent the 2 VCC logic high level from forward biasing the p-n junction formed by the source and drain of the PMOS capacitor configured transistor with the well, the source, drain and well are coupled together. The charge transfer stage also includes a p-n junction diode coupled from the output of the stage to ground.

15 Claims, 10 Drawing Sheets

HIGH VOLTAGE CHARGE TRANSFER STAGE

The present invention relates generally to semiconductor devices, and more particularly to a charge transfer stage that can be used in a charge pump system.

BACKGROUND OF THE INVENTION

Charge pumps are commonly used in flash and other types of memory devices to provide voltages outside of the range of ground to the power supply voltage. In some flash memory devices, charge pumps are used to generate large negative voltages, such as −11 V, to erase or program memory cells. Other flash memory devices use large positive voltages to erase or program memory cells.

Figure 1:
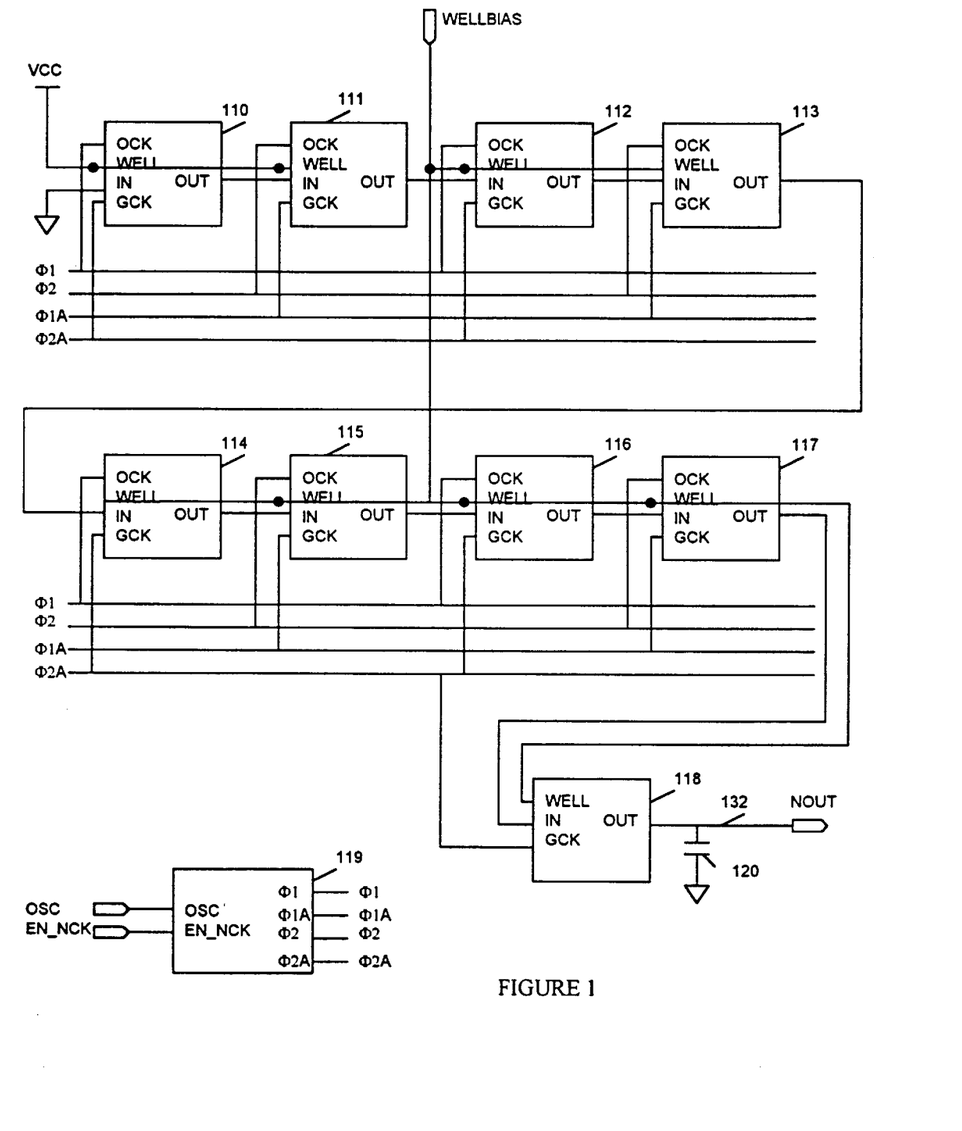
FIG. 1 illustrates a block diagram of an eight stage charge pump system in which the present invention can be implemented.
Figure 2:
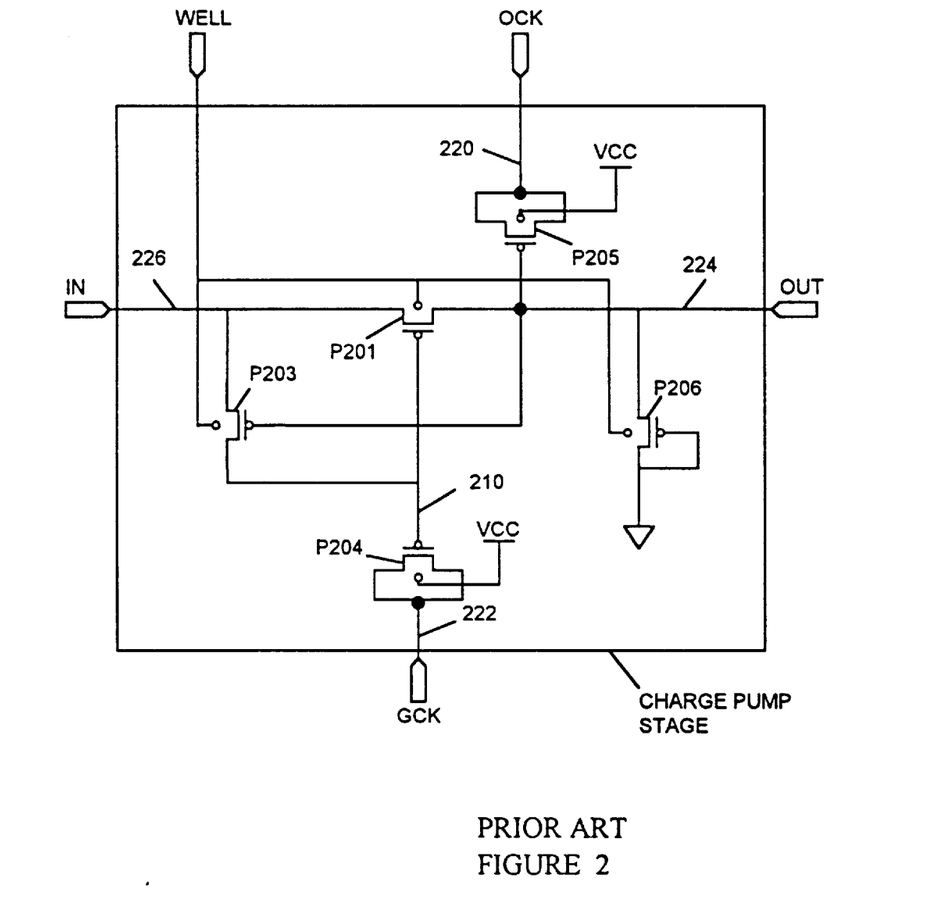
FIG. 2 illustrates a circuit diagram of a conventional charge pump stage for charge pump stages 110–117 shown in FIG. 1.
Figure 3:
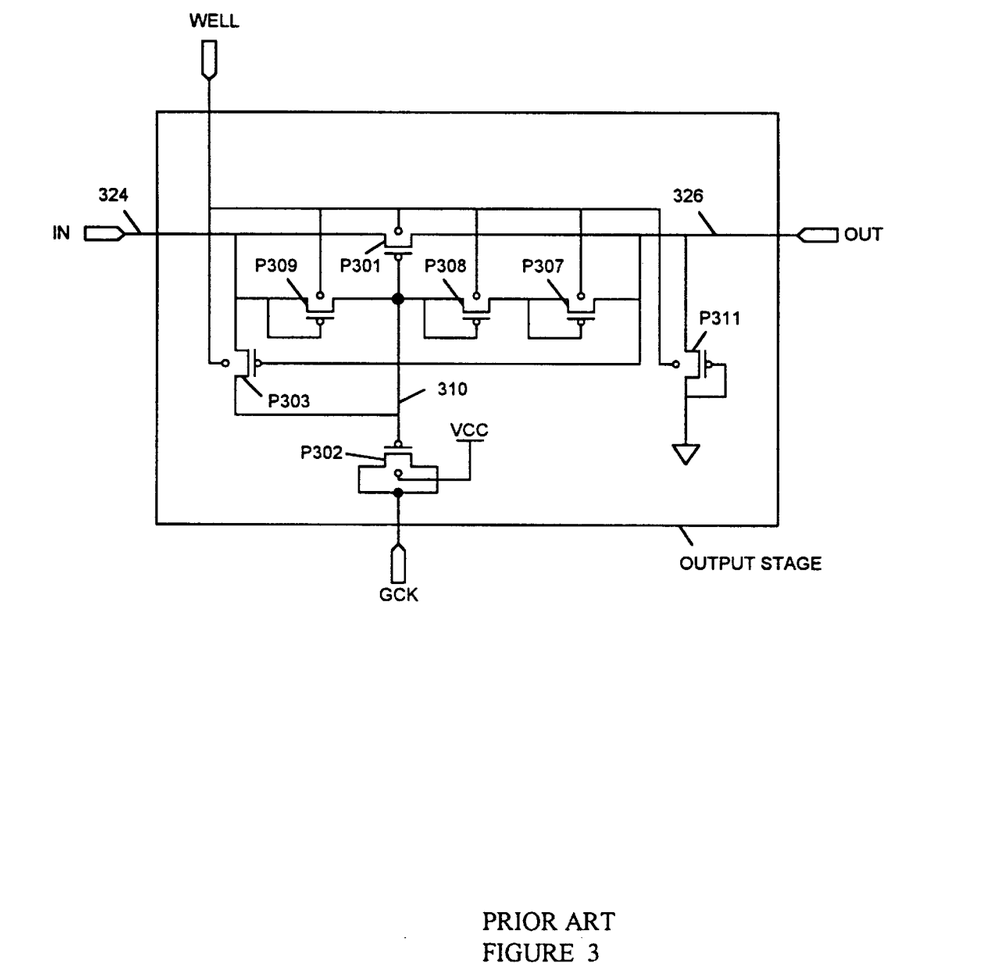
FIG. 3 illustrates a circuit diagram of a conventional output stage 118 shown in FIG. 1.
Figure 4:
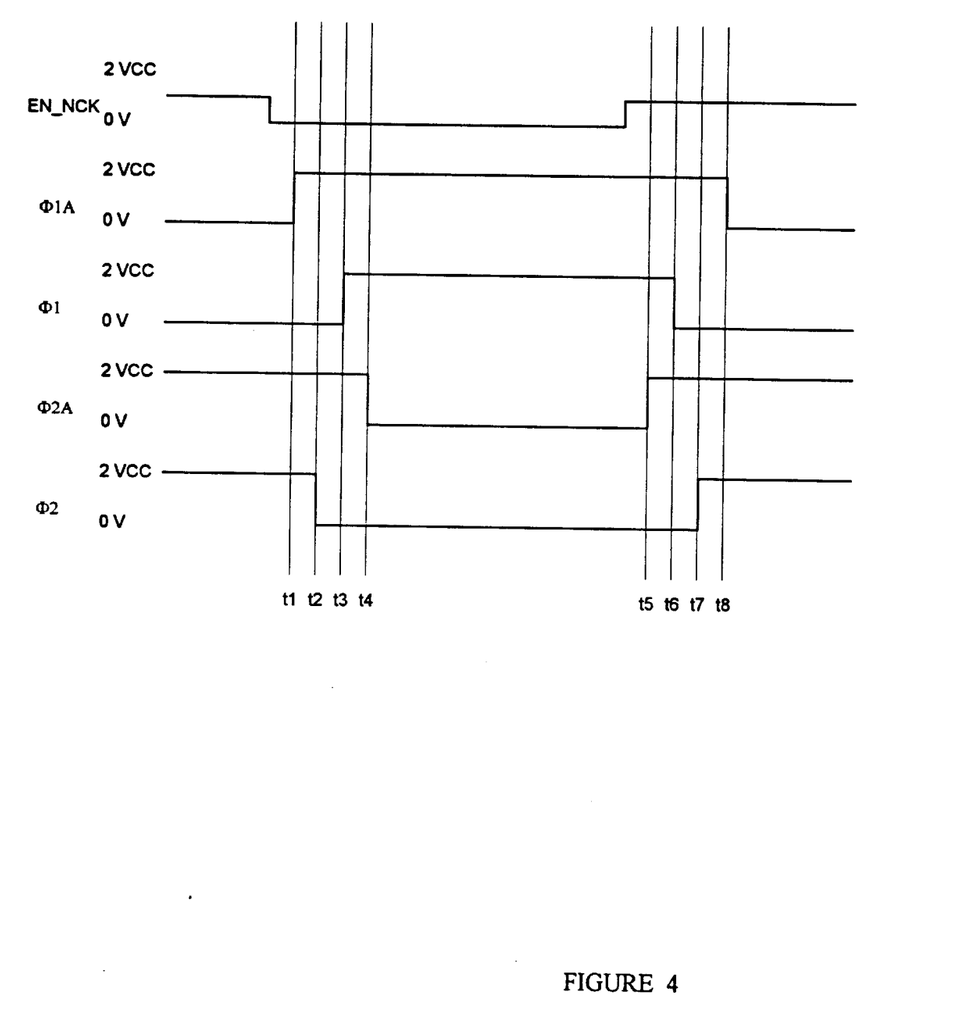
FIG. 4 illustrates a timing diagram of the clock signals in the charge pump system of FIG. 1.

An eight stage charge pump using a four phase clock is illustrated in FIG. 1. The charge pump system is comprised of eight charge pump stages 110–117, an output circuit 118, and a four phase clock generator 119. The four clock signals generated by clock 119 are labeled $\phi 1$, $\phi 1A$, $\phi 2$ and $\phi 2A$. The eight charge pumps are connected in series so that the output of each charge pump provides a larger magnitude output voltage than the previous charge pump. The charge pump system of FIG. 1 is a negative charge pump system. A conventional circuit for charge pump stages 110–117 is illustrated FIG. 2. A conventional circuit for output stage 118 is illustrated in FIG. 3. A timing diagram of the clock signals in the charge pump system is shown in FIG. 4.

The charge pump system of FIG. 1 transfers negative charge from one charge pump stage to the next charge pump stage, and ultimately to NOUT 132. The system also transfers positive charge back through preceding charge pump stages to ground. The FIG. 2 charge pump circuit includes clock terminals OCK 220 and GCK 222, capacitor configured PMOS transistors P204 and P205 coupled to the clock terminals, PMOS pass transistor P201 coupled to IN 226 and OUT 224, and diode configured pull-down PMOS transistor P206. In operation, at stage 114 when the $\phi 1$ clock signal coupled to OCK 220 goes high at time t3 shown in FIG. 4, positive charge is coupled through the large capacitor formed by capacitor configured PMOS transistor P205 to node 224. At this time, the clock signal coupled to GCK 222 is low and PMOS pass transistor P201 is on. Positive charge is thereby coupled through transistor P201 and IN 226 to the preceding charge pump stage, stage 113.

When the $\phi 2A$ clock signal goes high at GCK 222 in stage 114 at time t5, positive charge is coupled through the small capacitor formed by capacitor configured PMOS transistor P204. This positive charge increases the voltage of node 210 and turns off PMOS pass transistor P201. When the positive charge coupled through P204 increases the voltage of node 210 beyond a threshold voltage above the OUT 224 voltage, this turns on PMOS transistor P203. Transistor P203 couples the excess positive charge from node 210 to IN 226. The positive charge is incrementally coupled through each of the preceding charge pump stages and eventually to ground. Transistor P203 turns off when the node 210 voltage is reduced to within a threshold voltage of the OUT 224 voltage. At this point the node 210 voltage is still high enough to keep transistor P201 off.

When the $\phi 1$ clock signal goes low at OCK 220 in stage 114 at time t6, it couples negative charge to node OUT 224. With transistor P201 off this negative charge is coupled to the next charge pump stage, stage 115, through OUT 224. This process of transferring positive charge to the preceding stage, and negative charge to the next stage is repeated at each charge pump stage.

The conventional output stage 118 illustrated in FIG. 3 includes PMOS pass transistor P301, three diode configured PMOS transistors P307–P309, a capacitor configured PMOS transistor P302 and a discharge PMOS transistor P303. In operation when the OCK clock signal at the preceding charge pump stage goes low, for example, signal $\phi 2$ at time t2 shown in FIG. 4, this couples negative charge to the IN 324 node. This negative charge is coupled through diode configured transistor P303 to pre-charge node 310. Node 310 is thereby pre-charged down to a diode drop above the IN 324 voltage. At time t4, when the $\phi 2A$ signal goes low, this couples negative charge to node 310. The drop in the node 310 voltage turns PMOS pass transistor P301 on which allows the negative charge from IN 324 to pass through to OUT 326. At time t5 $\phi 2A$ goes high at the output stage GCK terminal. This couples positive charge to node 310. When the node 310 voltage rises a threshold voltage above the IN 324 voltage, PMOS transistor P303 turns on. Node 310 then discharges through transistor P303 until the node 310 voltage is brought up to a threshold voltage below the IN 324 voltage. This process is repeated, and after a number of clock cycles, a large negative output voltage is provided at NOUT 132.

As the magnitude of the negative output voltage increases in the charge pump, the junction breakdown voltage limits the output voltage range. The voltage at the gate, node 310, of PMOS pass transistor P301 must be a threshold voltage below the OUT 326 voltage to turn transistor P301 on. The threshold voltage $V_T$ for PMOS transistors increases with the bulk (substrate) to source voltage according to the equation $V_T = V_{TO} - g(\text{sqrt}(\phi + V_{BS}) - \text{sqrt}(\phi))$, where $V_{BS}$ is the bulk to source voltage, $V_{TO}$ is threshold voltage for $V_{BS}=0$, g is the bulk threshold parameter and $\phi$ is the strong inversion surface potential. As the negative output voltage at each stage is increased the bulk to source voltage increases, and therefore a larger negative voltage is required at the gate of transistor P301 to turn the transistor on. Furthermore, to drive the output voltage negative quickly the node 310 voltage should be driven lower than the threshold voltage. In one semiconductor process, the junction breakdown voltage is −13 V. The node 310 voltage is then self-limited to −13 V. With a threshold voltage of −2.5 V, the conventional output stage of FIG. 3 would be unable to provide a −11 V OUT 326 voltage because of the inability to drive node 310 beyond −13 V. The junction breakdown voltage limits the current drive capability of PMOS transistor for output voltages near −11 V because of the inability to provide a sufficiently large overdrive voltage at node 310. Attempts to drive node 310 to a negative voltage larger than −13 V could cause the p+ source to n-well junction of PMOS transistor P303 to breakdown, which could in turn cause a latch-up condition or an operational error.

Thus an improved charge pump stage that overcomes these and other problems of the prior art would be highly desirable.

SUMMARY OF THE INVENTION

The present invention provides an improved charge transfer stage with an expanded output voltage range and high charge transfer efficiency. In one embodiment the charge transfer stage is implemented as an output stage in a four phase clock negative charge pump system. The charge transfer stage comprises a PMOS pass transistor coupling the transfer stage input and output, a resistor between the transfer stage input and the pass transistor gate, a clock terminal, a capacitor configured PMOS transistor coupling the clock terminal to the gate of the pass transistor, and a diode from the transfer stage output to ground.

In operation when the transfer stage input goes low, charge is coupled through the resistor to pre-charge the gate of the pass transistor. The resistor has a higher junction breakdown voltage than a transistor which allows the gate of the pass transistor to be driven to a larger voltage. Driving the gate of the pass transistor to a larger voltage increases the output voltage range of the transfer stage and increases the conductance of the pass transistor which improves the charge transfer efficiency.

The large negative voltages at the charge transfer stages outputs increases the threshold voltage of the pass transistor due to the body effect. To provide sufficient charge to turn on the pass transistor a logic high level greater than the power supply, such as 2 VCC, can be used for the clock signal coupled through the capacitor configured transistor to the gate of the pass transistor. To prevent the 2 VCC logic high level from forward biasing the p-n junction formed by the source and drain of the PMOS capacitor configured transistor with the well, the source, drain and well are coupled together. The charge transfer stage also includes a p-n junction diode coupled from the output of the stage to ground. The diode keeps the output voltage from rising above the diode turn-on voltage.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 5:
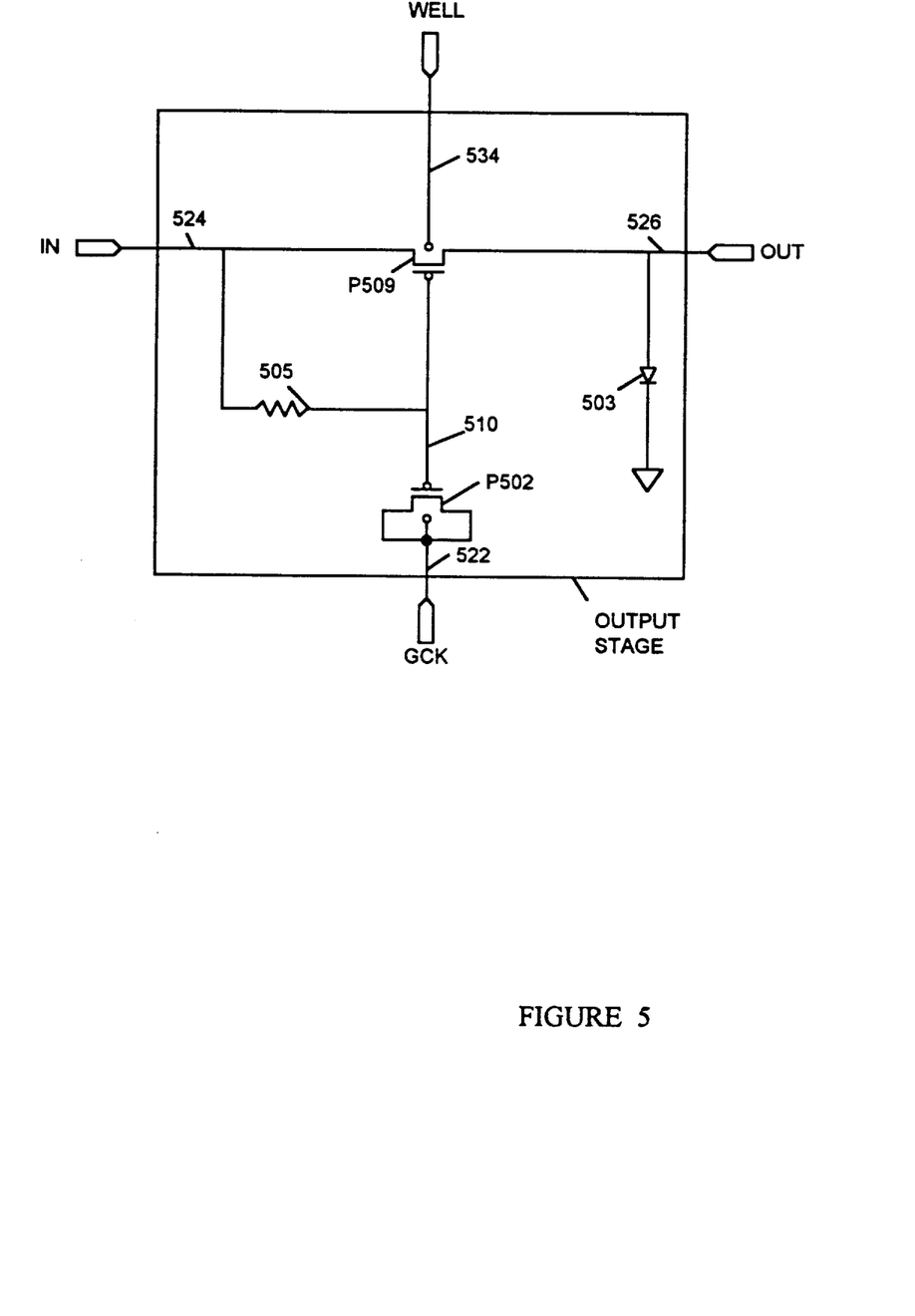
FIG. 5 illustrates a negative charge pump output stage according to one embodiment of the present invention.

FIG. 5 illustrates a negative charge pump output stage according to one embodiment of the present invention. The FIG. 5 charge pump output stage includes PMOS pass transistor P509, resistor 505, capacitor configured PMOS transistor P502 and diode 503. In the FIG. 5 charge pump output stage resistor 505 replaces transistors P303, P307, P308 and P309 which are used in the FIG. 3 prior art output stage. In one embodiment, resistor 505 is a p-well resistor, where the resistance is generated by the current flowing from one contact on the p-well to the other contact on the p-well. The p-well is inserted in an n-well. The resistor p-well has less dopant than p-diffusions for the PMOS transistors. Typically the PMOS transistors use a shallow junction with a high dopant concentration, as result the junction breakdown voltage for the p-well resistor is substantially larger than the breakdown voltage for typical PMOS transistors. For example, in one embodiment, the p+ to n-well junction breakdown voltage for the PMOS transistors is about −13 V, whereas the resistor p-well to n-well junction breakdown voltage is about −18 V. The larger junction breakdown voltage of resistor 505 allows node 510 to be driven to larger voltages without damaging the device. Driving node 510 to larger voltages increases the output drive current capability of the charge pump and increases the output voltage range.

Another feature of the FIG. 5 charge transfer stage that facilitates high voltage operation is coupling the substrate terminal of capacitor configured PMOS transistor P502 to the source and drain terminals. The large voltages generated at the output of the charge transfer stage increases the threshold turn-on voltage for PMOS pass transistor P509. In one embodiment with a −10 V OUT 526 voltage the transistor P509 threshold voltage is typically 2.5 V. Furthermore to provide a low resistance path between IN 524 and OUT 526, the gate of transistor P509 should be driven to 2.5 or more volts above the transistor P509 threshold voltage. With a 2.5 V power supply the GCK 522 clock voltage high level is about 2.5 V. This is typically too low to provide a strong turn-on signal and thereby a high current drive capability. When a low power supply voltage is used, a logic high level of greater than VCC can provide the desired overdrive voltage. In one embodiment, a logic high level of 2 VCC is used for the GCK 522 clock signal. Techniques for maximizing the efficiency of charge transfer stages are described in co-pending patent application Ser. No. 08/920,613, filed Aug. 27, 1997 and entitled "SYSTEM AND METHOD FOR A LOW VOLTAGE CHARGE PUMP WITH LARGE OUTPUT VOLTAGE RANGE," assigned to the assignee of the present invention and incorporated herein by reference. To prevent this high voltage signal from forward biasing the p-n junction between the PMOS transistor P502 source or drain and the n-well, the n-well is coupled to the transistor P502 source and drain. Coupling the source, drain and n-well ensures that the voltage across the p-n junction between the source or drain and the n-well is kept below the junction turn-on voltage. When the charge pump system is powered using a larger supply voltage, such as 5 V, a GCK 522 high clock signal level below 2 VCC can typically be used.

Figure 8:
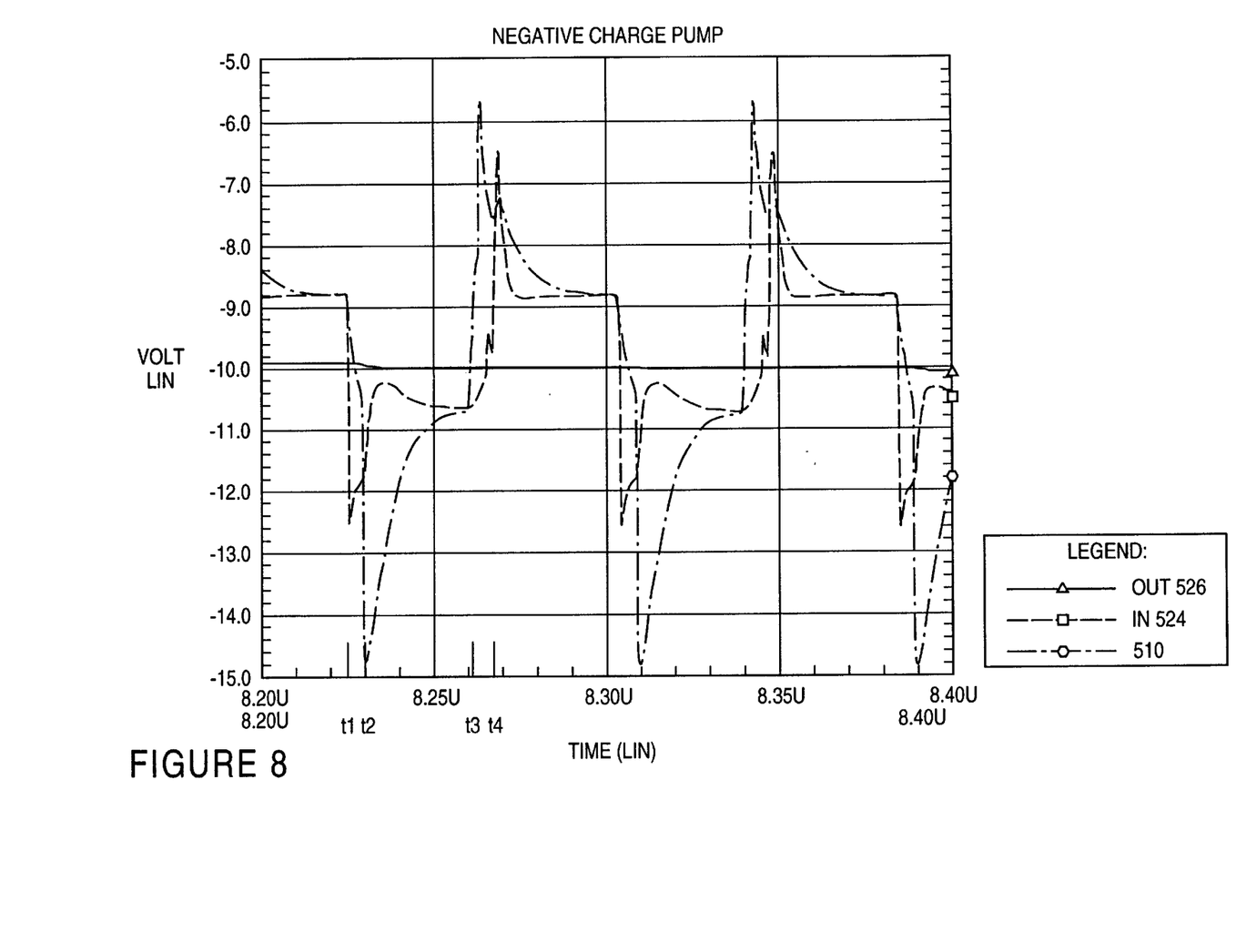
FIG. 8 illustrates a simulation of the voltages at three nodes in the FIG. 5 charge transfer stage.
Figure 9:
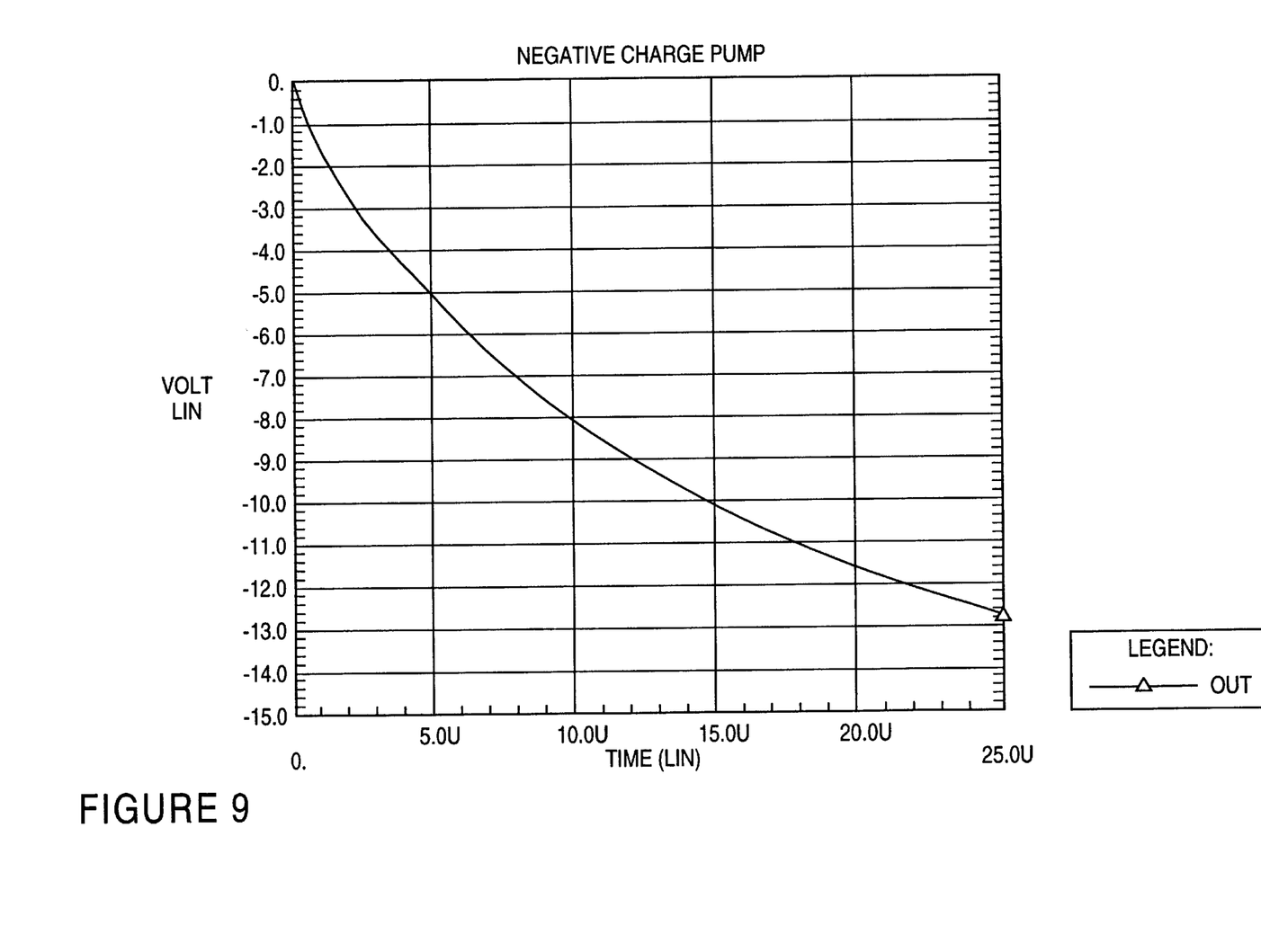
FIG. 9 illustrates a simulation of the change in output voltage of a charge pump using the FIG. 5 charge transfer stage.

The operation of the FIG. 5 charge pump output stage is illustrated in the simulation shown in FIG. 8. FIG. 8 illustrates the voltages at node IN 524, node 510 and node OUT 526 over two clock cycles. The embodiment of FIG. 8 has a 2.5 V power supply and a 10 k ohm resistor 505. In operation, at FIG. 8 time t1 the OCK clock signal at the preceding charge pump stage goes low. This causes node IN 524 to go low, and couples negative charge through resistor 505 to pre-charge node 510. At FIG. 8 time t2 the GCK clock signal at node 522 goes low. This couples more negative charge to node 510, which drives node 510 to a negative voltage more than one threshold voltage below the OUT 526 voltage. This turns PMOS pass transistor P509 on. Negative charge is then coupled from IN 524 to OUT 526 through transistor P509 to provide the charge pump output current. At FIG. 8 time t3 the GCK 522 signal goes high which couples positive charge through capacitor configured transistor P502 to node 510. This turns off PMOS transistor P509. At FIG. 8 time t4 the OCK clock signal at the preceding charge pump stage goes high. Transistor P509 is off so this positive charge is isolated from OUT 526. The positive charge is coupled through to the preceding charge pump and ultimately to ground. This process is repeated over numerous cycles to produce a large negative output voltage at OUT 526. The change in the OUT 526 voltage over time during a pump down process using a 2.5 V power supply and a 10 k ohm resistor 505 is illustrated in FIG. 9. This charge pump embodiment produces a −12.7 V output voltage in 25 μs.

After the high negative voltage operation is complete, for example after a flash memory finishes programming or erasing memory cells, the OUT 526 voltage returns to approximately ground. This reduces the strain on the junctions and thereby improves the mean time to failure of the device. The large negative voltage at node 510 at the end of a negative voltage operation is discharged through resistor 505 to IN 524.

Diode 503 is coupled between OUT 526 and ground. When OUT 526 is near ground diode 503 keeps the OUT 526 voltage from rising above a diode drop over ground. Using a p-n junction diode for diode 503 provides a stronger clamp on the OUT 526 voltage than a conventional diode configured transistor coupled to ground.

Figure 5A:
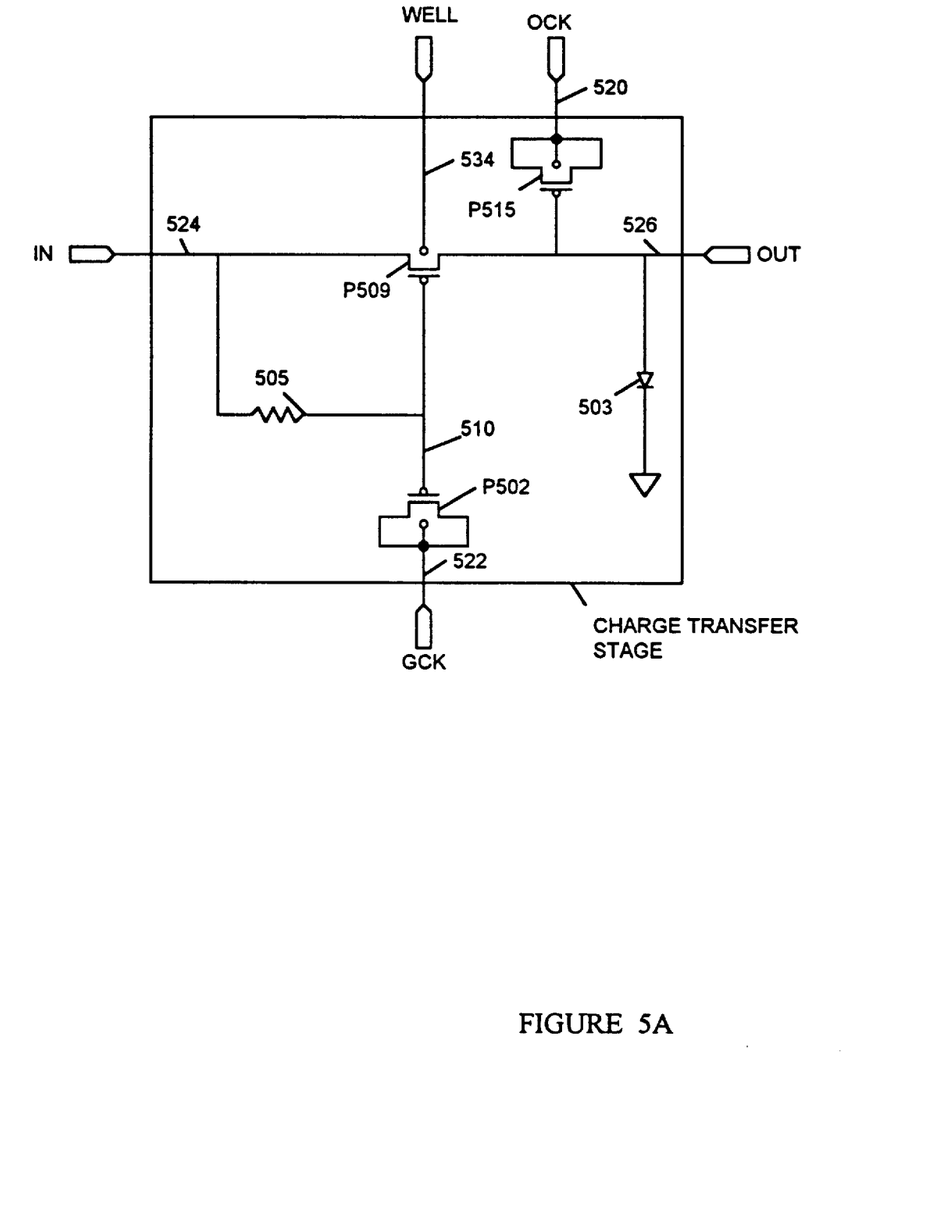
FIG. 5A illustrates a negative charge transfer stage according to one embodiment of the present invention.

FIG. 5A illustrates a charge transfer stage according to one embodiment of the present invention. The FIG. 5A charge transfer stage can be used, for example, for charge pump stages 110–117 illustrated in FIG. 1. The FIG. 5A circuit is similar to the FIG. 5 circuit with the addition of the OCK clock signal and PMOS transistor P515. The operation of the FIG. 5A charge transfer stage is also similar to the FIG. 5 output stage. Looking at the operation of the FIG. 5A circuit when implemented as charge pump stage 117 in FIG. 1. φ1 is coupled to the OCK 520 clock terminal of charge pump stage 116. Referring to the timing diagram illustrated in FIG. 4, when φ2A goes high at time t5 it couples positive charge from GCK 522 to the gate of PMOS transistor P509 in charge pump stage 116. This turns off transistor P509. Shortly thereafter when φ1 goes low at time t6, it couples negative charge to the OUT 526 node of charge pump 116. Transistor P509 being off in stage 116 prevents the negative charge at the charge pump stage 116 OUT 526 node from being coupled back to stage 115. The negative charge is therefore coupled to the IN 524 node of charge pump stage 117. Resistor 505 couples the negative charge to the gate of pass transistor P509, node 510.

φ2 is coupled to the OCK 520 node in charge pump stage 117. At time t7 φ2 goes high which transfers positive charge to OUT 526 in stage 117. This at least pre-charges the stage to transfer charge when φ1A goes low at time t8, and where the voltage difference between gate node 510 and OUT 526 exceeds the Vt of transistor P509, φ2 going high starts the transfer of negative charge from IN 524 to OUT 526. φ1A is coupled to the GCK 522 clock terminal of charge pump stage 117. At time t8 φ1A goes low which couples negative charge through capacitor configured PMOS transistor P502 to the gate of PMOS pass transistor P509. This turns transistor P509 on. Coupling the negative charge through resistor 505 before φ1A goes low pre-charges node 510, so that when φ1A goes low transistor P509 turns on more strongly thereby increasing the conductance of transistor P509. A high P509 conductance is important to maximize the efficiency of the charge pump stage.

At time t1 φ1A goes high. This couples positive charge through capacitor configured PMOS transistor P502 to the gate of PMOS pass transistor P509. This turns transistor P509 off. At time t2 φ2 goes low which couples negative charge from OCK 520 to OUT 526. Because transistor P509 is off, this negative charge is coupled to output stage 118. At time t3 φ1 goes high. This couples positive charge from the OCK 520 clock terminal in charge pump stage 116 to the OUT 526 node in stage 116. Shortly thereafter at time t4 φ2A goes low which turns on the PMOS pass transistor P509 in stage 116. Because at time t4 transistor P509 in stage 116 is on and transistor P509 in stage 117 is off, the positive charge is coupled back through stage 116 to stage 115. This process is repeated to produce the desired output voltage. After the high negative voltage operation is complete, the OUT 526 node returns to approximately ground. The negative charge at node 510 discharges through resistor 505 to bring node 510 up to approximately ground.

Positive Charge Transfer Stage

Figure 6:
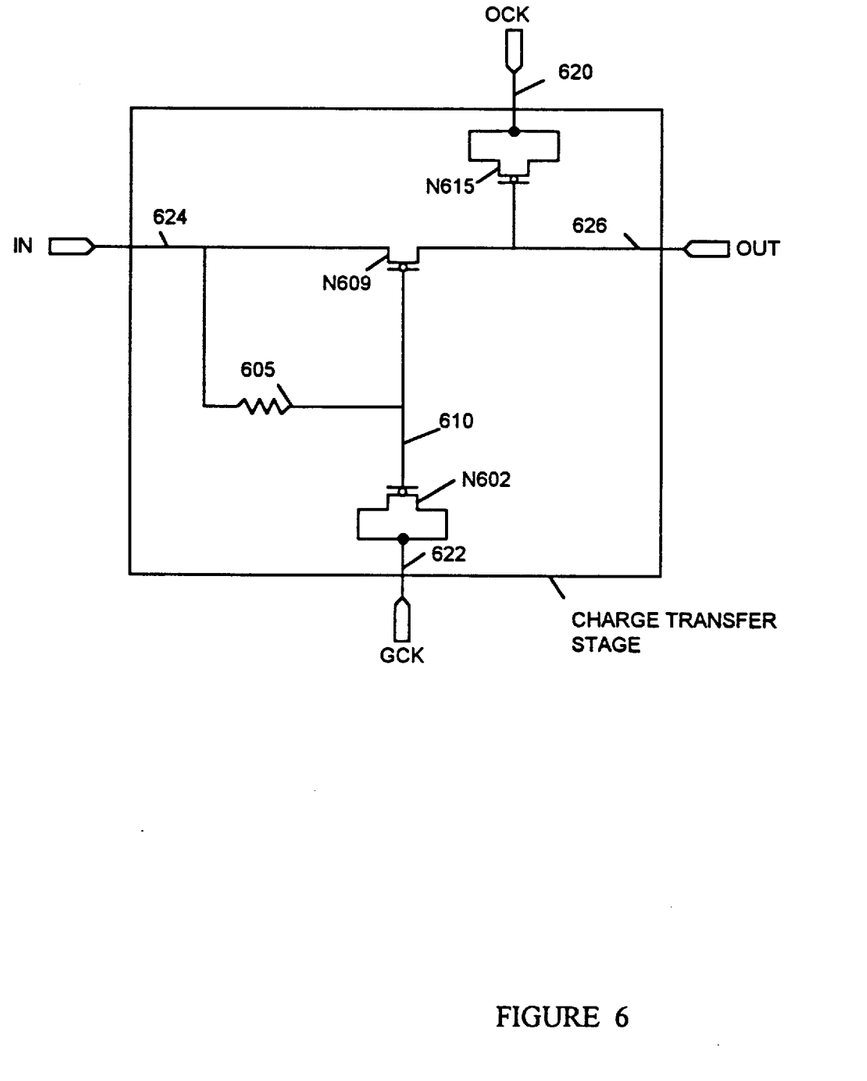
FIG. 6 illustrates a positive charge transfer stage according to one embodiment of the present invention.

FIG. 6 illustrates a positive charge transfer stage according to one embodiment of the present invention. The FIG. 6 charge transfer stage includes native mode NMOS pass transistor N609, resistor 605 coupled between the IN 624 node and the gate of transistor N609, capacitor configured native mode NMOS transistor N602 coupled to GCK clock terminal 622, and capacitor configured native mode NMOS transistor N615 coupled between OCK 620 and OUT 626. Native mode transistors are NMOS transistors that have a lower threshold voltage than typical NMOS enhancement mode transistors. A typical native mode transistor threshold voltage is 0.2 V, whereas a typical NMOS enhancement mode transistor threshold voltage is 0.7 V. The charge transfer stage as shown in FIG. 6 can be used as a charge pump stage to couple positive charge to successive charge pump stages and negative charge to preceding charge pump stages. Where the FIG. 6 charge transfer stage is used as an output stage, transistor N615 and clock terminal OCK 620 can be removed.

The operation of the FIG. 6 charge transfer stage is similar to the operation of the FIG. 5 charge transfer stage with the voltage polarities reversed. The operation of the FIG. 6 charge transfer stage is illustrated in the context of one stage operating as part of a series of charge transfer stages in a four phase clock charge pump system as shown in FIG. 1. When the clock at OCK 620 goes high, positive charge is coupled through capacitor configured NMOS transistor N615 to OUT 626. In the next charge transfer stage, this positive charge is coupled through resistor 605 to node 610 in that stage which pre-charges node 610. Using a resistor to couple charge between node IN 624 and node 610 rather than a transistor allows node 610 to be driven to higher voltages without forward biasing a p-n junction. The ability to drive node 610 to higher voltages in turn enables the charge transfer stage to provide higher output voltages at node OUT 626.

When the clock signal at OCK 620 goes high or shortly thereafter NMOS pass transistor N609 in the present charge transfer stage should be off. The positive charge is thereby coupled to the next charge transfer stage. After a certain delay the clock at GCK 622 goes high which couples positive charge to node 610, the gate of NMOS pass transistor N609. This turns transistor N609 on. Shortly thereafter the clock at OCK 620 goes low. This couples negative charge through capacitor configured transistor N615 to OUT 626. At this time or shortly thereafter the NMOS pass transistor N609 in the subsequent charge transfer stage should be off. With transistor N609 off in the subsequent stage, the negative charge is not transferred to the subsequent stage. Having pass transistor N609 on in the present stage then couples the negative charge back to the preceding charge transfer stage and ultimately to ground. This process can be repeated over numerous cycles to provide a large positive output voltage.

After the high voltage operation is finished, node OUT 626 discharges to approximately ground. Node IN 624 discharges to approximately ground through pass transistor N609. Node 610 then discharges through resistor 605 to IN 624.

Output Resistor Embodiment

Figure 7:
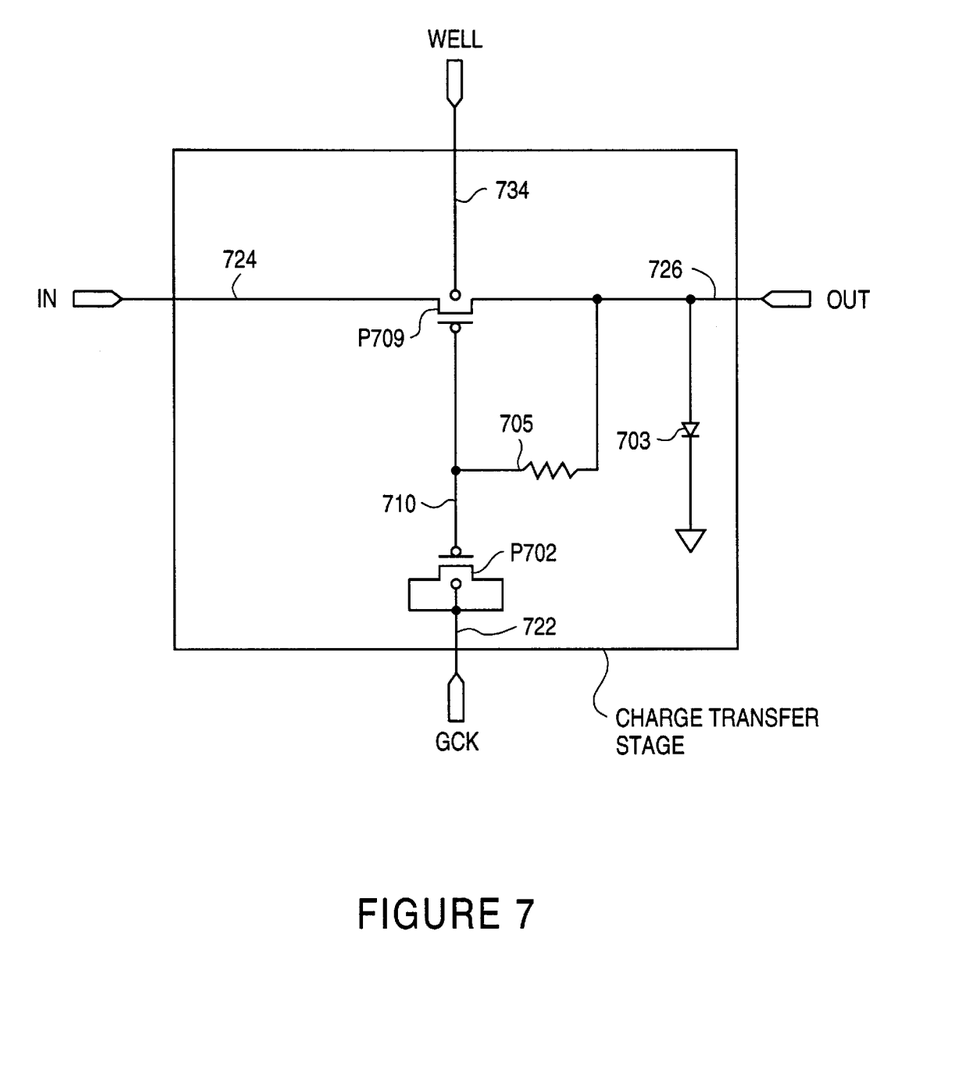
FIG. 7 illustrates a negative charge transfer stage according to another embodiment of the present invention.

FIG. 7 illustrates a negative charge transfer stage according to another embodiment of the present invention. In the FIG. 7 charge transfer stage embodiment resistor 705 is coupled between node 710 and OUT 726. The FIG. 7 charge transfer stage further includes PMOS pass transistor P709 coupled between IN 724 and OUT 726, capacitor configured PMOS transistor P702 coupled between clock terminal GCK 722 and the gate of pass transistor P709, and diode 703 coupled between OUT 726 and ground. The FIG. 7 charge transfer stage is a negative charge transfer stage. To convert the FIG. 7 charge transfer stage to a positive charge transfer stage, the p-channel transistors P702 and P709 are replaced with n-channel transistors, and diode 703 is removed.

The placement of resistor 705 between OUT 726 and node 710 causes the gate of pass transistor P709 to be pre-charged from OUT 724. By contrast the FIG. 5 charge transfer stage embodiment pre-charges the gate of pass transistor P509 from IN 524 through resistor 505. The FIG. 7 charge transfer stage thereby provides an alternative for output stage 118 shown in FIG. 1. In operation, when the GCK 722 clock signal is high, pass transistor P709 is off and IN 724 is isolated from OUT 726. Negative charge from OUT 726 is coupled through resistor 705 to pre-charge node 710. When the GCK 722 clock signal goes low negative charge is coupled through capacitor configured PMOS transistor P702 to node 710 the gate of PMOS pass transistor P709. This turns transistor P709 on. With pass transistor P709 on charge is coupled from IN 724 to OUT 726 to provide output current. When the GCK 722 clock signal transitions high positive current is coupled through to the gate of pass transistor 709 which turns transistor 709 off. The source, drain and substrate terminal of transistor P702 are coupled together to prevent GCK 722 logic high levels greater than VCC from forward biasing the p-n junction between the source or drain and the substrate.

Similar to the FIG. 5 charge transfer stage embodiment, after the negative voltage operation is complete, OUT 726 returns to approximately ground. Charge is then transferred through resistor 705 to bring up node 710 to approximately ground. With OUT 726 near ground, diode 703 prevents the OUT 726 voltage from rising above the turn-on voltage of the diode, which is typically 0.7 V. Using a p-n junction diode rather than a diode configured transistor provides a stronger clamp on the OUT 726 positive voltage.

Thus an improved charge transfer stage with an expanded output voltage range and high charge transfer efficiency has been described. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A charge transfer circuit comprising:
   an input terminal, an output terminal, a first transistor, a first clock terminal, a capacitor, and a resistor;
   said first transistor having a first, a second and a third terminal, said first transistor first terminal coupled to said input terminal, said first transistor second terminal coupled to said output terminal;
   said resistor coupled in series between said input terminal and said first transistor third terminal;
   said capacitor coupled in series between said first clock terminal and said first transistor third terminal.

2. The charge transfer circuit of claim 1 wherein said capacitor comprises a second transistor having a first, a second, and a third terminal, said first terminal and said second terminal coupled to said first clock terminal, said third terminal coupled to said first transistor third terminal.

3. The charge transfer circuit of claim 2 wherein said second transistor further comprises a well terminal, said well terminal coupled to said second transistor first terminal and said second transistor second terminal.

4. The charge transfer circuit of claim 3 further comprising a second clock terminal and a third transistor having a first, a second and a third terminal, said first terminal and said second terminal coupled to said second clock terminal, said third terminal coupled to said output terminal.

5. The charge transfer circuit of claim 4 further comprising a diode, said diode coupled between said output terminal and ground.

6. The charge transfer circuit of claim 5 wherein said resistor comprises a p-well resistor.

7. The charge transfer circuit of claim 6 wherein said charge transfer circuit comprises a flash memory device charge pump stage.

8. The charge transfer circuit of claim 4 wherein said first and second transistors are NMOS transistors.

9. A charge transfer circuit comprising:
   an input terminal, an output terminal, a first transistor, a clock terminal, a capacitor and a resistor;
   said first transistor having a first, a second and a third terminal, said first transistor first terminal coupled to said input terminal, said first transistor second terminal coupled to said output terminal;
   said resistor coupled in series between said output terminal and said first transistor third terminal;
   said capacitor coupled in series between said clock terminal and said first transistor third terminal.

10. The charge transfer circuit of claim 9 wherein said capacitor comprises a second transistor having a first, a second, and a third terminal, said first terminal and said second terminal coupled to said clock terminal, said third terminal coupled to said first transistor third terminal.

11. The charge transfer circuit of claim 10 wherein said second transistor further comprises a well terminal, said well terminal coupled to said second transistor first terminal and said second transistor second terminal.

12. The charge transfer circuit of claim 11 further comprising a diode, said diode coupled between said output terminal and ground.

13. The charge transfer circuit of claim 12 wherein said resistor comprises a p-well resistor.

14. The charge transfer circuit of claim 13 wherein said charge transfer circuit comprises a flash memory device charge pump stage.

15. The charge transfer circuit of claim 11 wherein said first and second transistors are NMOS transistors.

* * * * *